United States Patent [19]

Orgill et al.

[11] Patent Number: 5,654,660

[45] Date of Patent: Aug. 5, 1997

[54] LEVEL SHIFTED HIGH IMPEDANCE INPUT MULTIPLEXOR

[75] Inventors: Rodney H. Orgill; William R. Mason, both of Colorado Springs, Colo.

[73] Assignee: Hewlett-Packard Company, Palo Alto, Calif.

[21] Appl. No.: 534,420

[22] Filed: Sep. 27, 1995

[51] Int. Cl.$^6$ .................. H03K 3/037; H03K 17/693
[52] U.S. Cl. .................. 327/407; 327/215; 327/99
[58] Field of Search ................ 327/199, 202, 327/203, 208, 215, 219, 225, 223, 407, 408, 409, 410, 333, 99

[56] References Cited

U.S. PATENT DOCUMENTS

| | | | |
|---|---|---|---|
| 4,806,786 | 2/1989 | Valentine | 327/203 |
| 4,820,939 | 4/1989 | Sowell et al. | 327/203 |
| 5,046,047 | 9/1991 | Cliff et al. | 365/201 |
| 5,099,143 | 3/1992 | Arakawa | 327/408 |
| 5,164,612 | 11/1992 | Kaplinsky | 327/408 |
| 5,173,626 | 12/1992 | Kudou et al. | 327/211 |
| 5,173,870 | 12/1992 | Sukashita et al. | 327/215 |
| 5,264,738 | 11/1993 | Veendrick et al. | 327/203 |
| 5,467,038 | 11/1995 | Motley et al. | 327/202 |
| 5,504,919 | 4/1996 | Lee et al. | 395/800 |

FOREIGN PATENT DOCUMENTS 637132  2/1995  European Pat. Off. ........... 327/215

*Primary Examiner*—Timothy P. Callahan
*Assistant Examiner*—My-Trang Nu Ton

[57] ABSTRACT

A high input impedance CMOS multiplexor. A buffer stage is connected to common outputs of a plurality of N-channel multiplexor switches. A pull up P-channel transistor in this buffer is connected to a voltage source which is equal to the maximum voltage output from one of the plurality of N-channel multiplexor switches. As such, the buffer output can be fully shut off when a logic "1" is output by one of the multiplexor switches. The input impedance of the multiplexor is approximately the input impedance of the buffer or approximately $10^{14}$ ohms.

6 Claims, 2 Drawing Sheets

5,654,660

LEVEL SHIFTED HIGH IMPEDANCE INPUT MULTIPLEXOR

FIELD OF THE INVENTION

The present invention relates to integrated circuit design and in particular to the design of high density high impedance multiplexors.

BACKGROUND OF THE INVENTION

In switch intensive chips such as field programmable gate arrays (FPGAs) chip area requirements dictate the use of N-channel only switches instead of complementary (P-channel and N-Channel) switches. The use of N-channel only switches results in less than rail to rail signal swings since the voltage out of a N-channel switch is (Vgate–Vthreshold).

When an CMOS inverter is driven from this less than full voltage swing signal, the P-channel device in the inverter is never turned completely off. This results in an undesirable DC current from the output of the inverter. One well known way of dealing with this unwanted current is to add a weak feedback inverter to raise the input level to the main inverter to Vdd and thereby allow the P-channel device in the inverter to shut off completely.

FIG. 1 illustrates a prior art multiplexor which uses a feedback inverter to restore the input level to the main inverter. As shown, four N-channel switches 101, 103, 105 and 107 are connected to form a 4 to 1 multiplexor as is known in the art. Input signals IN1–IN4 are the signal inputs to the N-channel switches 101–107 respectively. Select signals S1–S4 control the gates of the N-channel switches 101–107, respectively, and serve to select which, if any, of the N-channel switches are turned to thereby allow the associated input signal to pass through the multiplexor.

The output of the multiplexor, Node A, feeds a main inverter 109. This inverter is designed as a standard CMOS inverter with a P-channel pull up transistor and a N-channel pull down transistor. The output of the main inverter becomes the circuit output 111.

A weak feedback inverter 113 is provided which has an input connected to the output of the main inverter. The output of the weak inverter is connected to the input of the main inverter (Node A). Inside the weak inverter is a two transistor CMOS inverter with the pull up and pull down transistors sized such that the output of the weak inverter can be overpowered by any of the N-channel switches 101–107 so the input to the main inverter can change. The P-channel pull up transistor in the weak inverter serves to pull up Node A to Vdd when a logic "1" is output on Node A by one of the N-channel switches.

While this circuit works generally, the downside of this design is the weak inverter changes the input impedance of the N-channel switches 101–107. While a typical CMOS transistor has an input of approximately $10^{14}$ ohms, since the output of the weak inverter is connected to Node A, the input impedance as seen by a device connected to any of the inputs IN1–IN4 is approximately $(30*10^3)$ ohms. In FPGAs where the fanout may be very large and the series resistance of long interchip interconnect lines may be high, this low input impedance becomes a problem. In particular a transistor driving one of the N-channel switch inputs may not be able to supply the current required to drive the input at high speed, if at all.

Therefore what is needed in the industry is a multiplexor which allows for the use of N-channel switches but retains a high impedance on the inputs to the switches.

SUMMARY OF THE INVENTION

The present invention is a high input impedance multiplexor. A buffer stage is connected to a common output from a plurality of N-channel multiplexor switches. A pull up P-channel transistor in this buffer is connected to a voltage source which equals (Vdd—VtN-channel switch) such that the buffer output can be fully shut off when a logic "1" is output by one of the N-channel multiplexor switches. The output of the buffer is fed through an isolation N-channel transistor to a main inverter and weak feedback inverter. As the buffer is between the output of the weak inverter and the outputs from the N-channel multiplexor switches, the input impedance as seen from a device driving a signal input to one of the N-channel multiplexor switches is approximately the input impedance of the buffer (high impedance).

This novel circuit allows for the use of N-channel switching transistors while maintaining a high input impedance and eliminating unwanted output current.

DETAILED DESCRIPTION OF THE INVENTION

Figure 2:
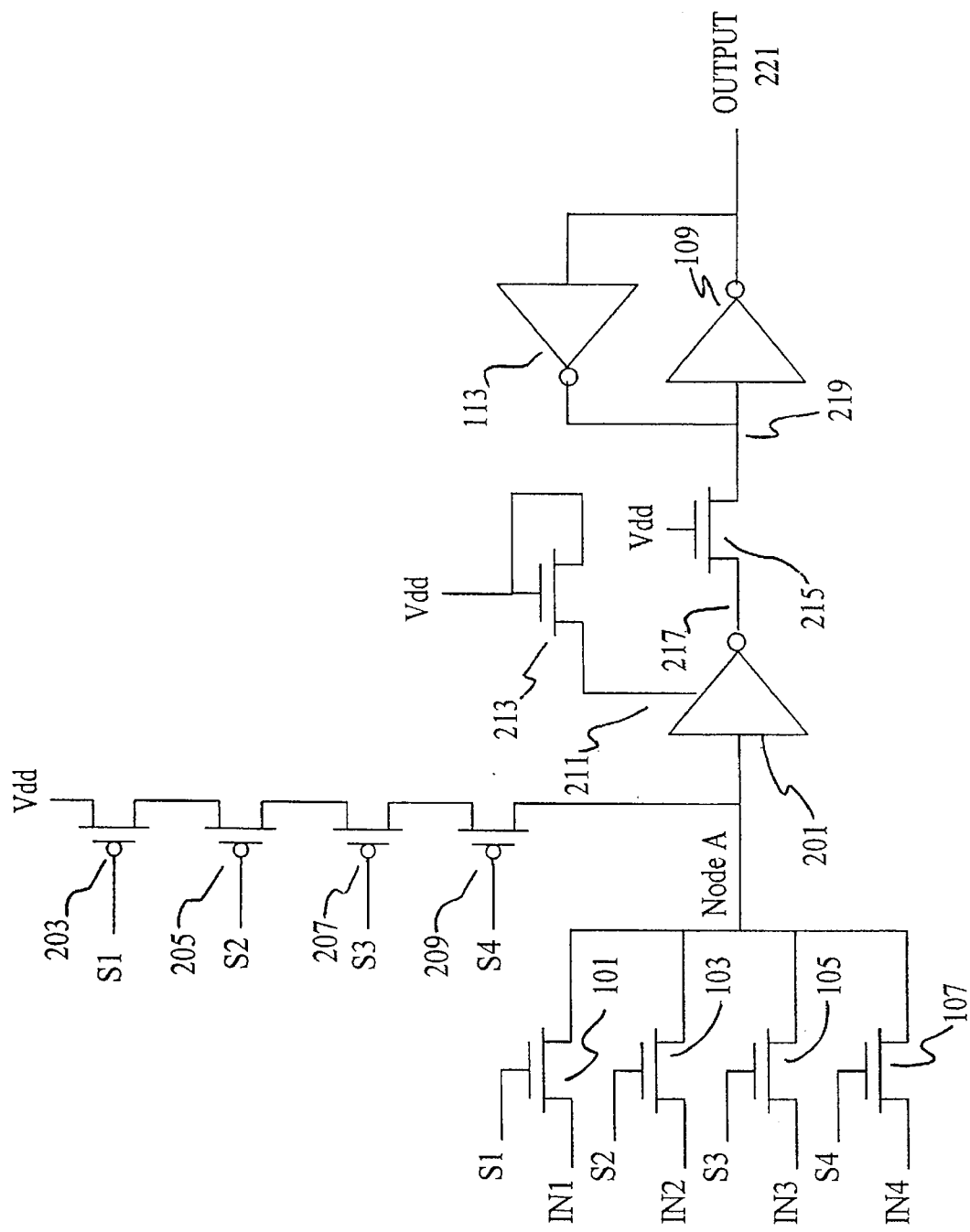
FIG. 2 illustrates a 4 to 1 CMOS multiplexor according to the present invention.

FIG. 2 illustrates the preferred embodiment of the present invention. As shown, the common output "Node A" of the N-channel switches feeds the input of a buffer 201. Also connected to Node A are four series connected pull up P-channel transistors 203, 205, 207 and 209.

The buffer 201 is constructed as a standard two transistor CMOS inverter with a P-channel pull up transistor and a N-channel pull down transistor. Instead of connecting the P-channel pull up transistor (inside 201) to Vdd as is normally done, the source of the P-channel transistor is connected to the drain 211 of a voltage drop N-channel transistor 213. The source and gate of transistor 213 are connected to Vdd.

An isolation N-channel transistor 215 is connected in series between the buffer 201 output 217 and the junction 219 of the main inverter 109 input and weak inverter 113 output. The output of the main inverter 109 becomes the circuit output 221.

Figure 1:
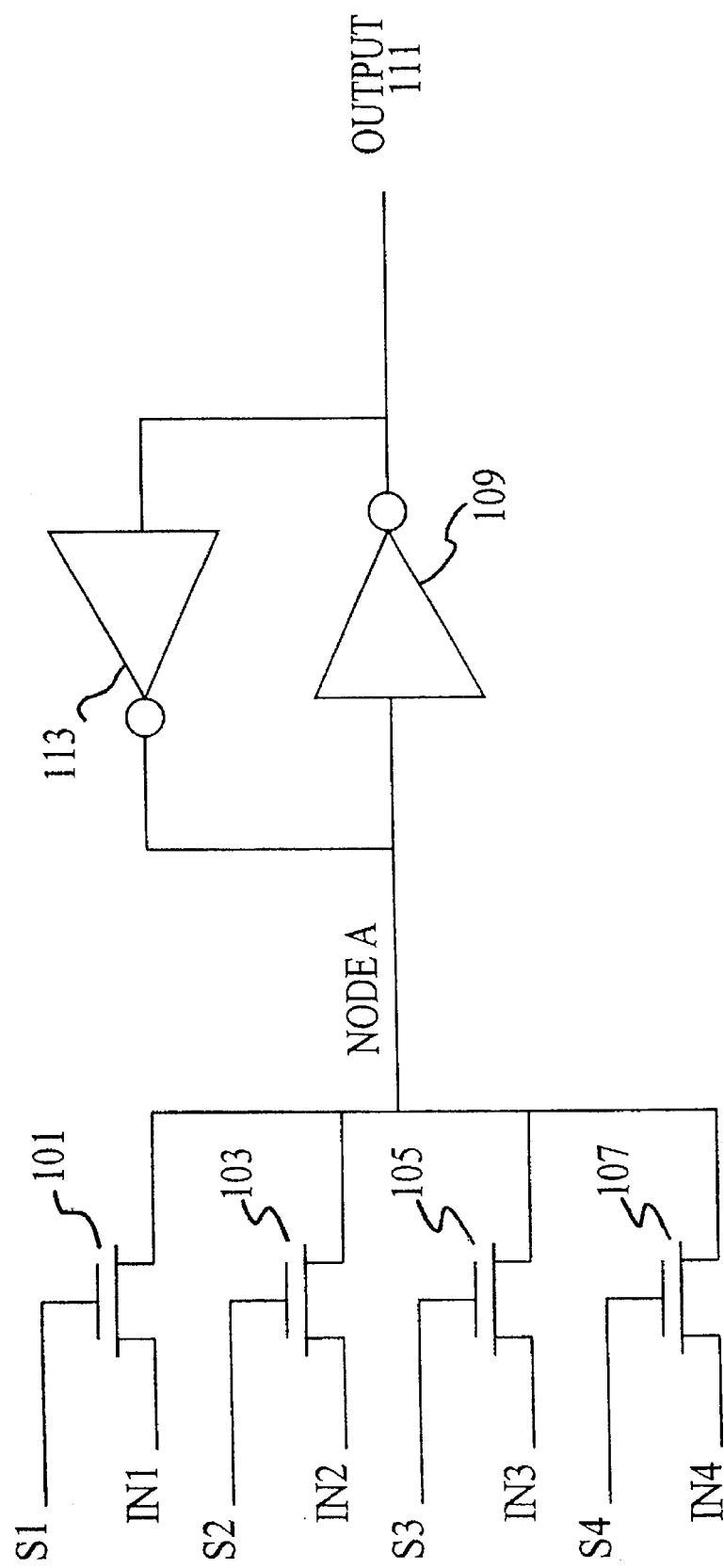
FIG. 1 illustrates a prior art CMOS 4 to 1 multiplexor.

In operation, the multiplexor switch transistors 101–107 operate as previously discussed in association with FIG. 1. The four pull up transistors 203–209 serve to keep Node A from "floating" when none of the mutiplexor switch transistors are selected (S1–S4 are at logic "0"). The maximum voltage present on Node A when a multiplexor switch is selected is (Vdd-Vt N-channel) as already discussed. Since the source voltage 211 for the CMOS buffer is (Vdd-Vt of N-channel transistor 213) the signal on Node A is rail to rail with respect to the buffer. As such, the P-channel pull up transistor in buffer 201 is completely shut off when a logic "1" is output onto Node A by one of the multiplexor switch transistors.

The output 217 of the buffer 201 is isolated from the higher voltage output of the weak inverter 113 by the series N-channel transistor 215. This transistor 215 keeps the drain of the P-channel pull up transistor inside buffer 201 from being at a higher voltage than the source voltage from the voltage drop transistor 213. This problem would occur without transistor 215 as the output of the weak inverter switches from rail to rail (Vdd to approximately 0.0 volts).

The main inverter provides the circuit output 221 and the weak inverter performs a level restore function for the main inverter as discussed in association with FIG. 1.

Through the addition of the buffer 201, the input impedance as seen by a device driving one of the N-channel inputs IN1–IN4 is the input impedance of the buffer 201 which is approximately $10^{14}$ ohms. Therefore this novel circuit allows the use of N-channel multiplexor switch transistors which is highly desirable in FPGAs while maintaining the high input impedance required for high fan out designs.

The foregoing description of the present invention has been presented for purposes of illustration and description. It is not intended to be exhaustive or to limit the invention to the precise form disclosed, and other modifications and variations may be possible in light of the above teachings. For example, the pull up transistors 203–209 can be replaced with a high resistance resister. The embodiment was chosen and described in order to best explain the principles of the invention and its practical application to thereby enable others skilled in the art to best utilize the invention in various other embodiments and various modifications as are suited to the particular use contemplated. It is intended therefore that the appended claims be construed to include other alternative embodiments of the invention except insofar as limited by the prior art.

I claim:

1. A high input impedance CMOS multiplexor having a plurality of N-channel multiplexor input switching transistors connected to a common output node comprising:

a main inverter having an input and an output;

a weak inverter having an input connected to the output of the main inverter and the weak inverter having an output connected to the input of the main inverter;

a buffer having an input connected to the common output node and the buffer having an output connected to the input of the main inverter; and the high input impedance of the CMOS multiplexor is approximately the high input impedance of the buffer when any signals are received by the plurality of N-channel multiplexor input switching transistors.

2. A high input impedance CMOS multiplexor as in claim 1 further comprising a turned-on isolation transistor wherein the output of the buffer is connected to the input of the main inverter through the isolation transistor in-order to isolate the buffer output from the output of the weak inverter.

3. A high input impedance CMOS multiplexor as in claim 2 further comprising:

a power supply providing a voltage Vdd coupled to power the turned-on isolation transistor;

a voltage source coupled to power the buffer and having voltage lower than the voltage Vdd powering the turned-on isolation transistor.

4. A high input impedance CMOS multiplexor as in claim 3 further comprising:

an N-channel transistor having a drain and a gate electrode coupled to the voltage Vdd and a source electrode forming the voltage source, wherein the voltage source coupled to power the buffer is less than Vdd by approximately one threshold voltage drop of the N-channel transistor.

5. A high input impedance CMOS multiplexor having a plurality of N-channel multiplexor input switching transistors each having a signal input node and a select input for selectively coupling the signal input node to a common output node, the multiplexor comprising:

a main inverter having an input and an output;

a weak inverter having an input connected to the output of the main inverter and the weak inverter having an output connected to the input of the main inverter;

an isolation transistor having an output connected to the input of the main inverter and the isolation transistor having a gate input connected to a first voltage source (Vdd) and the isolation transistor having an input;

a buffer having an input connected to the common output node and the buffer having an output connected to the input of the isolation transistor, a second voltage source coupled to power the buffer, the second voltage source having a voltage less than Vdd by an amount approximately equal to a threshold voltage of the N-channel multiplexor input switching transistors so that the maximum voltage at the common output node substantially equals the voltage of the second voltage source in-order to shut off the buffer; and a pull up device coupled between the first voltage source and the common output node and controlled by each of the select inputs of the input switching transistors which operates to keep the common output node from floating in the event none of the plurality of N-channel multiplexor input switching transistors connected to the common output node are conducting current.

6. A high input impedance CMOS multiplexor as in claim 5 wherein:

the pull up device includes a plurality of series connected transistors which are controlled by the select inputs.

* * * * *